(12) United States Patent
Rashid et al.

(10) Patent No.: US 7,741,195 B2
(45) Date of Patent: Jun. 22, 2010

(54) METHOD OF STIMULATING DIE CIRCUITRY AND STRUCTURE THEREFOR

(75) Inventors: Mohammed K. Rashid, Austin, TX (US); Mahbub M. Rashed, Austin, TX (US); Scott S. Roth, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 615 days.

(21) Appl. No.: 11/420,551

(22) Filed: May 26, 2006

(65) Prior Publication Data

US 2007/0275539 A1   Nov. 29, 2007

(51) Int. Cl.
*H01L 21/00* (2006.01)
(52) U.S. Cl. ............... 438/462; 438/460; 257/E21.523; 257/E21.524
(58) Field of Classification Search ................... 438/462
See application file for complete search history.

(56) References Cited

U.S. PATENT DOCUMENTS

| | | | |
|---|---|---|---|
| 5,399,505 A | 3/1995 | Dasse et al. | |
| 5,654,588 A * | 8/1997 | Dasse et al. | 257/754 |
| 6,844,631 B2 | 1/2005 | Yong et al. | |
| 6,921,979 B2 | 7/2005 | Downey et al. | |
| 7,224,042 B1 * | 5/2007 | McCollum | 257/620 |
| 2003/0219913 A1 * | 11/2003 | Pourkeramati et al. | 438/12 |
| 2005/0067616 A1 | 3/2005 | Lien et al. | |
| 2005/0070085 A1 | 3/2005 | Huang et al. | |
| 2005/0098903 A1 | 5/2005 | Yong et al. | |

OTHER PUBLICATIONS

Robert J. Small, Shihying Lee, Eric Finson, and David Maloney, "Experimenting with new cleaning technologies for use in semiconductor manufacturing," DuPont Electronic Technologies website, micro paper Apr. 2002.

* cited by examiner

*Primary Examiner*—Alexander G Ghyka
*Assistant Examiner*—Seahvosh J Nikmanesh
(74) *Attorney, Agent, or Firm*—Kim-Marie Vo; Joanna G. Chiu

(57) ABSTRACT

A method includes providing a wafer having a first die and a scribe grid, where the first die has die circuitry and a bond pad electrically connected to the die circuitry, and where the scribe grid has a scribe grid pad electrically connected to the die circuitry. The method further includes accessing the scribe grid pad to stimulate the die circuitry. A wafer includes a first die. The first die includes die circuitry, a plurality of conductive layers, and a bond pad electrically connected to the die circuitry via at least one conductive layer of the plurality of conductive layers. The wafer includes a scribe grid having a scribe grid pad, and an interconnect electrically connecting the scribe grid pad to the die circuitry. The plurality of die of the wafer can then be singulated, and at least one of the singulated die can be packaged.

20 Claims, 9 Drawing Sheets

METHOD OF STIMULATING DIE CIRCUITRY AND STRUCTURE THEREFOR

FIELD OF THE INVENTION

This invention relates generally to stimulating die circuitry, such as probing a semiconductor device.

BACKGROUND

After manufacturing a semiconductor wafer having die, it is desirable to test the circuitry on the die. The die includes probe pads, which may also serve as bond pads, used to test the circuitry. Alternatively, the die may include separate probe and bond pads. When dielectric materials having dielectric constants less than the dielectric constant of silicon dioxide (low-k dielectrics) or dielectric materials having dielectric constants equal to the dielectric constant of silicon dioxide are used as the interlevel dielectric layers (ILD) under the probe pads, the circuitry may be damaged (e.g., cracked) during probing because the low-k dielectric materials and underlying circuitry, if any, do not provide sufficient support. The damaged circuitry can lead to a reliability problem long after testing, such as when the circuitry is out in the field. To prevent damaging the circuitry, the number of times the circuit is probed (the number of touchdowns) is limited. By limiting the number of touchdowns, the amount of data that can be collected is undesirably decreased. Alternatively, the problem can be solved by adding additional probe pads to the die; however, this undesirably increases die size. Therefore, a need exists for probing die without damaging the underlying circuitry or having to limit the number of touchdowns.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Die circuitry is stimulated or tested to determine if a die is functional (i.e., good enough to continue along in the semiconductor manufacturing process to be packaged.) The die circuitry is stimulated by accessing on off-die pad (e.g., a scribe grid pad, which is an off-die pad located in the scribe grid). The off-die pad is electrically connected to the die circuitry to be stimulated. The electrical connection can be via conductive layer(s), structure (s), material(s), or combinations of the above. In one embodiment, the electrical connection is an interconnect, such as a strap. In another embodiment, the electrical connection is embedded in the layers underlying the top surface of the semiconductor wafer. The electrical connection may disposable. In one embodiment, the electrical connection or part of it is disposed of prior to singulation and in another embodiment, the electrical connection or part of it is disposed of during singulation. In one embodiment, the electrical connection is broken prior to singulation, and in another embodiment it is broken during singulation. These embodiments and others are better understood by turning to the figures.

Figure 1:
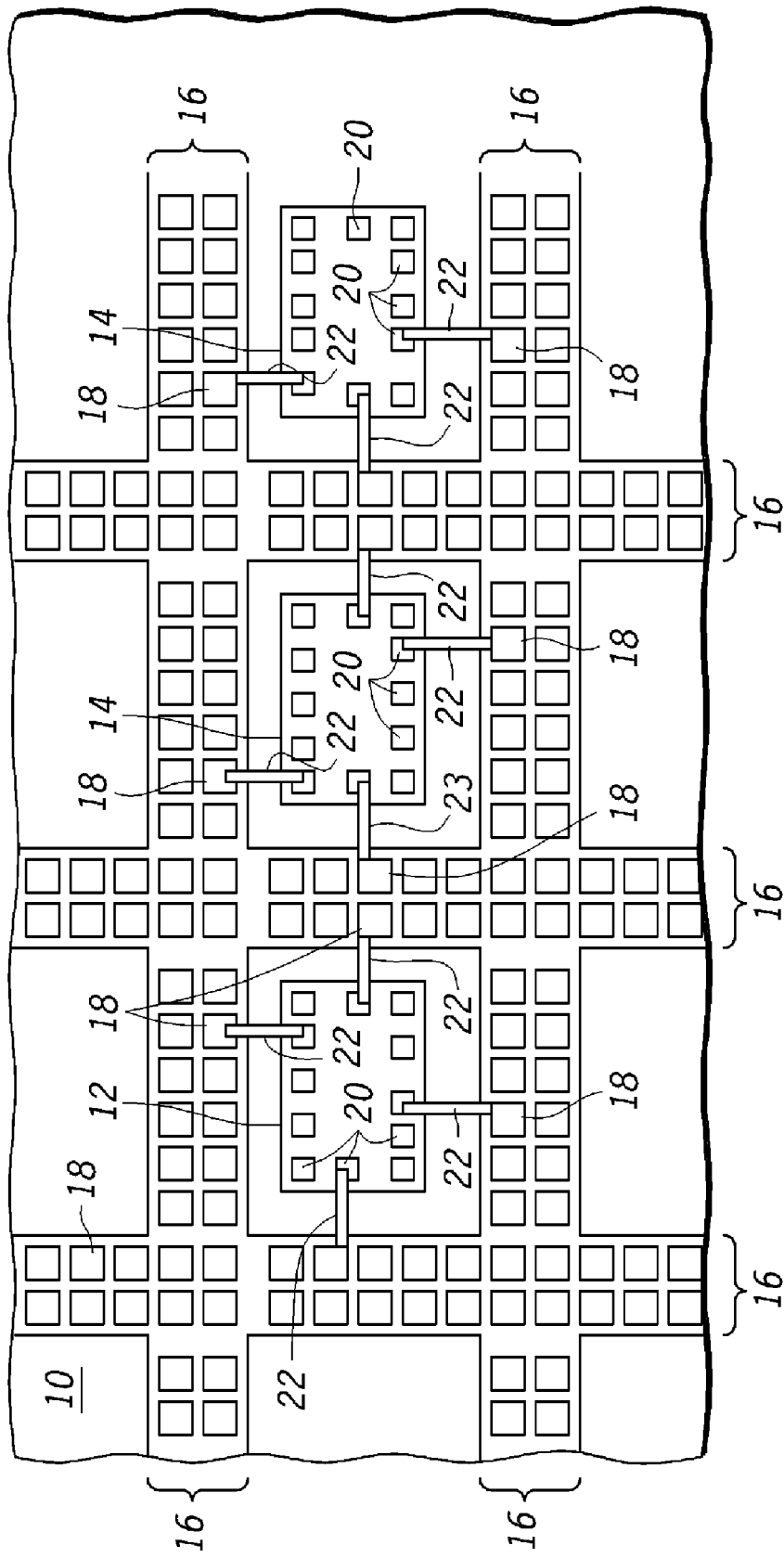
FIG. 1 illustrate a top down view of portions of a semiconductor wafer according to one embodiment.

FIG. 1 illustrates a semiconductor wafer 10 including die 12 and 14 that are separated from each other on the semiconductor wafer 10 by scribe grids 16. The scribe grids 16 may also be called streets, kerfs, scribes, or the like. The die 12 and 14 include die circuitry, which may be a single device or multiple devices. The die circuitry may be any type of circuitry. For example, the die 12 and 14 may include both logic and memory circuit elements. The die 12 and 14 also include bond pads 20, which are used when packaging the die 12 and 14. For example, a wirebond may be placed during a packaging process on the bond pads 20. The bond pads 20 may be any suitable material, such as aluminum, or any suitable combination of materials, such as copper capped with aluminum.

The scribe grids 16 include scribe grid pads (SGP) 18, which in one embodiment are scribe grid probe pads (SGPP). The scribe grid pads 18 may be pads for active or passive process structures. The active or passive process structures may be called scribe grid process controls (SGPC), process controls, wafer acceptance test (WAT) structures, or in-line test structures. As will be better understood after further explanation at least one of the scribe grid pads 18 is used for stimulating die circuitry. Thus, the pads for the active or passive process structures are being used as probe pads for the die 12 and 14.

For the scribe grid pads 18 to be used as probe pads, the scribe grid pads 18 are electrically connected to the die circuitry. In one embodiment, the scribe grid pads 18 are electrically connected to the die circuitry through a bond pad 20 by interconnects 22 and 23. As will be better understood after further explanation the interconnects 22 and 23 can be formed in various ways and may be any conductive material or combination of conductive materials.

As shown in FIG. 1, the scribe grids 16 include multiple rows of scribe grid pads 18, which in the embodiment illustrated are two rows of scribe grid pads 18. However, any number of scribe grid pads 18 may be used. In addition, the scribe grid pads 18, although shown as being equally spaced from each other and in rows, can be in any other arrangement. Although the scribe grid pads 18 are illustrated as squares, they can be any other shapes. Furthermore, they all do not need to be the same shape or size as each other. Any size(s) can be used. In FIG. 1 multiple scribe grid pads 18 are illustrated and only some are coupled to the die 12 and 14. In some embodiments, all scribe grid pads are coupled to the die 12 and 14 and in other embodiments, only a subset of all of the scribe grid pads are coupled to the die 12 and 14. It may be desirable to have only a subset of all of the scribe grid pads coupled to the die 12 and 14 so that the ones not coupled to the die are used for parametric testing of scribe circuitry. However, even if a scribe grid pad is coupled to active or passive scribe circuitry, it can also be used to stimulate die circuitry. The scribe circuitry may not interfere with the die circuitry depending on the stimulation involved and type of circuitry.

Figure 2:
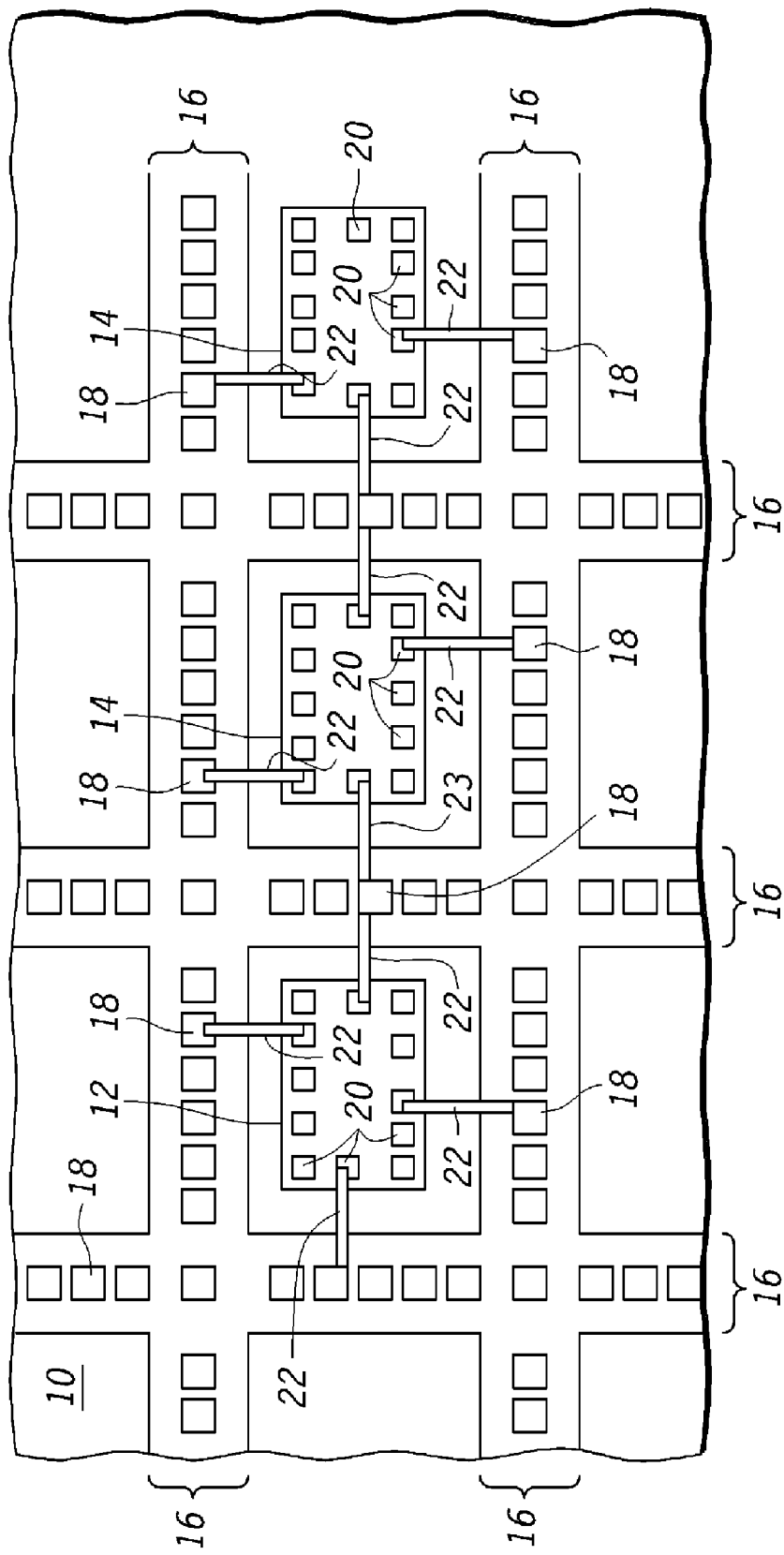
FIG. 2 illustrates a top down view of a portion of a semiconductor wafer according to another embodiment.

FIG. 2 illustrates a different arrangement of scribe grid pads 18 than shown in FIG. 1. In FIG. 2, the semiconductor wafer 10 has only one row of periodic scribe grid pads 18 in the scribe grids 16. In this embodiment, adjacent die 12 and 14 share a common periodic scribe grid pad 18. In other words, two die 12 and 14 may have interconnects 22 and 23 electrically connected to the same scribe grid pad 18.

Figure 3:
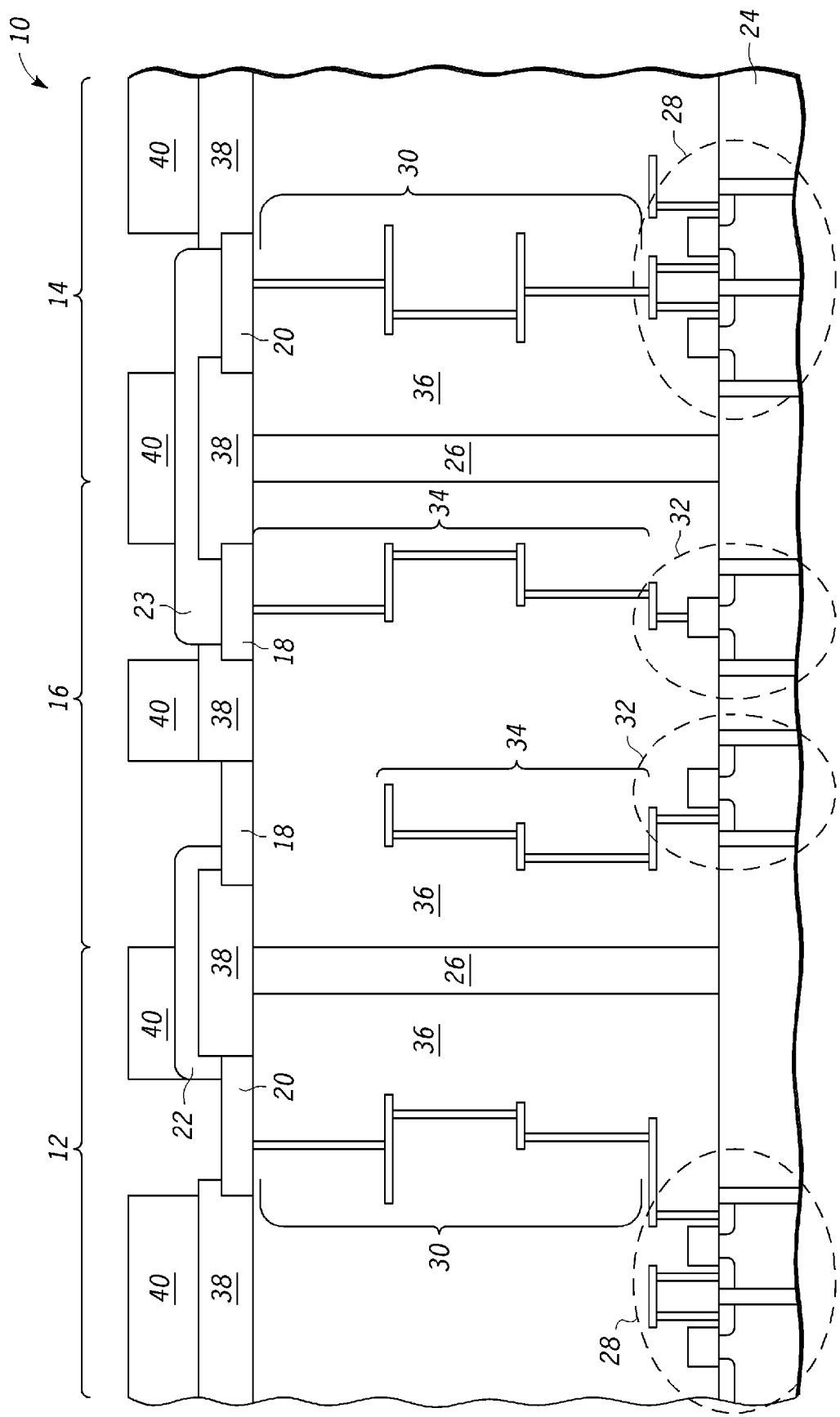
FIGS. 3-4 illustrate cross-sectional views of a portion of a semiconductor wafer according to one embodiment.

FIG. 3 illustrates a cross-sectional view of a portion of the die 12 and a portion of the adjacent die 14 of FIG. 1. The semiconductor wafer 10 includes an active surface 24, which is electrically connected to the edge seal 26. In the active surface 24, parts of the die circuitry 28 are formed. The active surface 24 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above. The die circuitry 28 is electrically connected to the bond pads 26 by die conductive layers 30, which are surrounded by a dielectric 36. The die conductive layers 30 may be any number of metal layers or conductive layers. The dielectric 36 may be multiple layers of the same material (e.g., silicon dioxide made by tetraethyl orthosilicate (TEOS)), multiple layers of different materials (e.g., silicon dioxide and a low-k dielectric), or a single material (e.g. a low-k dielectric or ultra low-k dielectric). For die 12, none of the die circuitry 28 is directly underneath the bond pad 20 although at least portions of the die metal layers 30 are located underneath the bond pad 20. However, for die 14 at least portions of the die circuitry 28 and the die metal layers 30 are directly underneath the bond pad 20. While it is likely that all die on the same semiconductor wafer will have none, all or at least portions of the die circuitry 28 directly underneath the bond pad, any may occur. As can be seen in FIG. 3, if the bond pads 20 were probe pads and if the dielectric 36 is soft material (e.g., a low-k dielectric material), when probing the bond pads 20 the die metal layers 30 and possibly the die circuitry 28 may be damaged; the die metal layers 30 and the dielectric 36 do not provide sufficient structural support.

In the scribe grids 16, the probe pads 18 are located over scribe metal layer 34 and may be located over portions of scribe circuitry 32. As previously described, the circuitry underneath the probe pads 18 may be active or passive. As shown in FIG. 3, the left-hand side probe pad 18 is passive because it is not electrically connected to the underlying scribe circuitry 32 and scribe metal layers 34. However, the right-hand side probe pad is active and electrically connected to the underlying scribe circuitry 32 and scribe metal layers 34. The scribe metal layers 34 may include any number of metal layers. Between the bond pads 20 and the scribe grid pads 18 are first passivation regions 38, which may be any passivation material, such as an insulating material (e.g., oxynitride or a composite of oxide and nitride). The first passivation regions 38 can be formed by any method (e.g., chemical vapor deposition (CVD) or spun-on) after forming the bond pads 20 and the probe pads 18. After forming the first passivation 38, the interconnects 22 and 23 may be formed. The interconnects 22 and 23 can be formed of any conductive material or materials, such as aluminum or nickel. The interconnects 22 and 23 can be formed by any process, such as sputtering. After forming the interconnects 22 and 23, a second passivation 40 may be formed using any of the material or processes previously described for the first passivation 38. In one embodiment, the second passivation 40 may not be formed. In one embodiment, the interconnects 22 and 23 are approximately 12,000 Angstroms of aluminum in thickness and the first and second passivation 38 and 40 are approximately 6,000 Angstroms in thickness.

The interconnect 22 overlies a portion of the first passivation 38 and at least a portion of the bond pad 20 and the scribe grid pad 18. In contrast, the interconnect 23 overlies a portion of the first passivation 38 and at least a majority of the bond pad 20 and the scribe grid pad 18. The interconnects 22 and 23 can cover all or any portion of the bond pad 20 or probe pad 18. Either situation or a similar modification can be used. The interconnects 22 and 23 should electrically couple a scribe grid pad 18 to the device circuitry 28. In the embodiment illustrated, the electrical connection is done via the bond pads 20 and the die metal layers 30.

Figure 4:
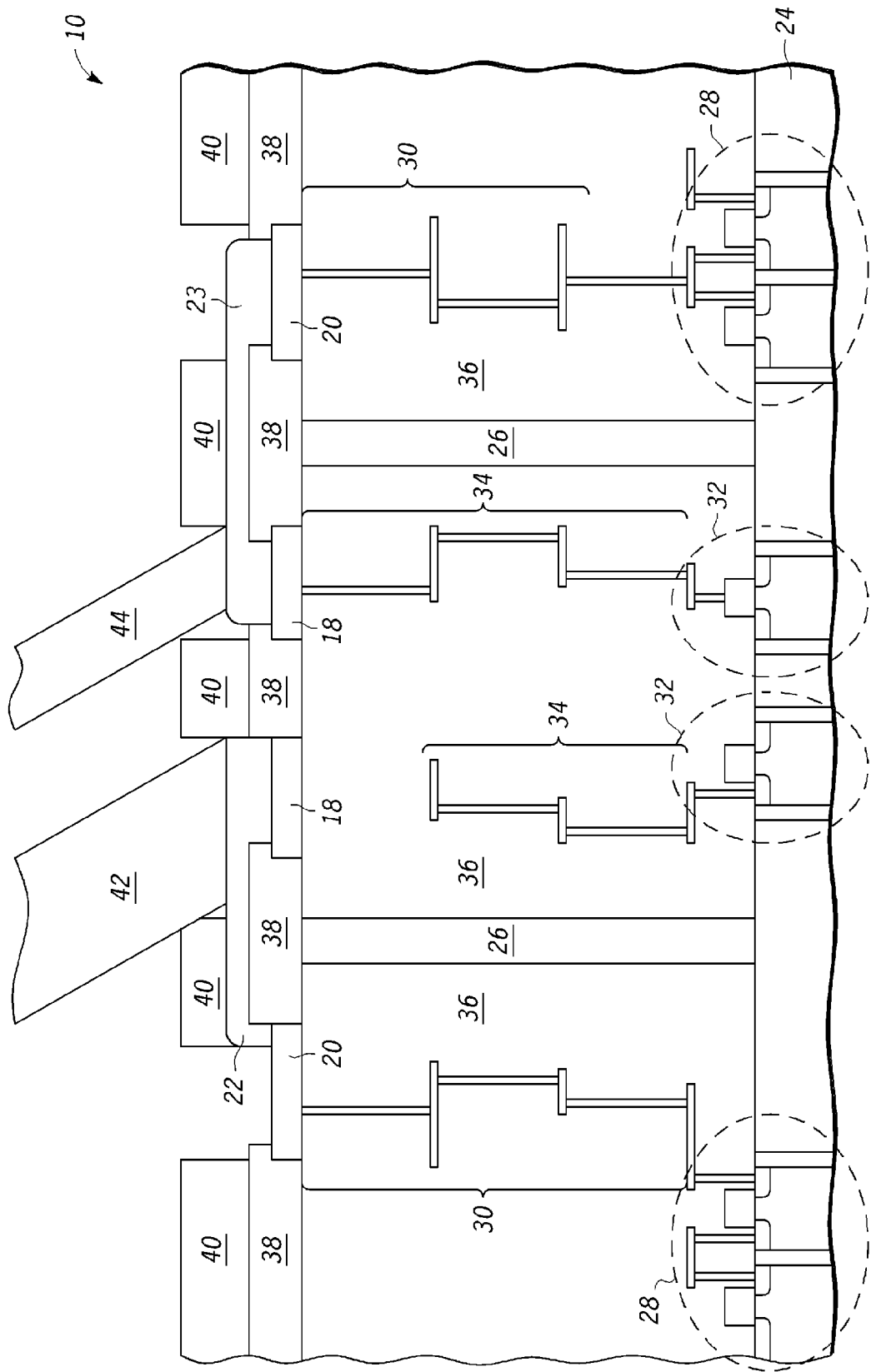

FIG. 4 illustrates one embodiment of accessing a scribe grid pad 18 to stimulate the die circuitry 28. In this embodiment, the accessing is performed using probe tips 42 and 44. However, any other suitable process (e.g., using a tester) or different probes (e.g., ones that do not intersect the semiconductor wafer 10 at a non-normal angle) may be used. The probe tip 42 accesses the scribe grid pad 18 via the interconnect 22 to stimulate the die circuitry 28. While contacting the interconnect 22, the probe tip 42 lands on a portion of the second passivation 40. While landing on a portion of the second passivation 40 is not required, doing so does not negatively effect the probing process because the scribe grid pad 18 can still be accessed to stimulate the die circuitry 28. The probe tip 44 accesses the scribe grid pad 18 via the interconnect 23, which is over at least a majority, if not all of the scribe grid pad 18. Unlike probe tip 42, the probe tip 44 does not lands on a part of the second passivation 40. Although the two illustrated scribe grid pads 18 are shown as being probed, not all of the scribe grid pads 18 may be probed. Instead, only a predetermined subset of a plurality of scribe grid pads 18 on the semiconductor wafer 10 or surrounding a die 12 and 14 are probed.

When stimulating the scribe circuitry 32, information about the die can be collected. When the die circuitry 28 is accessed from the scribe grid pad, the information about the die is collected via the scribe grid.

Figure 5:
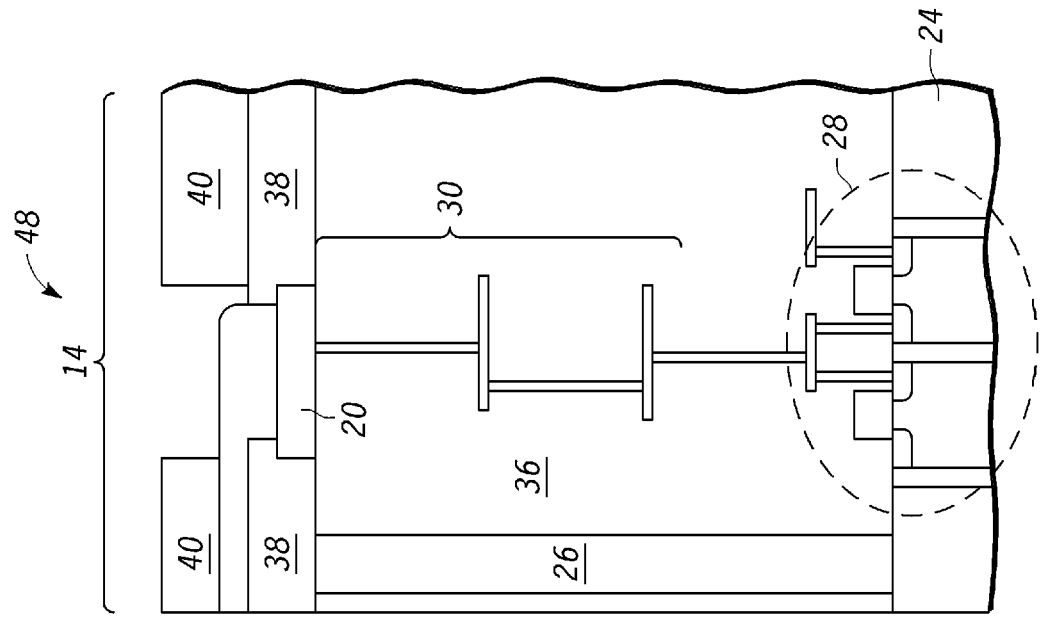
FIG. 5 illustrates the semiconductor wafer of FIG. 4 after singulation.
Figure 5:
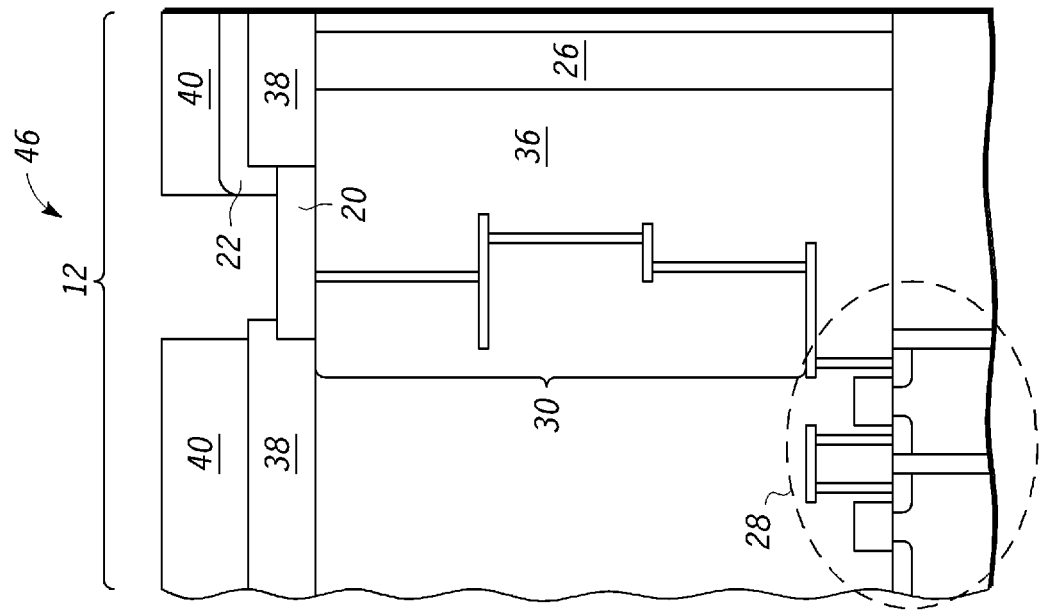

After accessing the scribe grid pads 18, the semiconductor wafer 10 is singulated to form singulated die 46 and 48, as shown in FIG. 5. The singulation process can occur by cutting (mechanically, via a laser, or the like), sawing, or the like the semiconductor die. During the singulation process, the electrical connection of the scribe grid pad 18 to the die circuitry 28 is broken if not previously broken. This can occur by the interconnects 22 and 23 being broken or disconnected from the bond pad 20 or the scribe grid pad 18 during singulation. For example, the saw may break the interconnects 22 and 23. Alternatively, the electrical disconnection between the scribe grid pad 18 and the die circuitry 28 may occur prior to singulation. If the interconnects 22 and 23 are not covered by the second passivation 40 they can be disconnected (e.g., removed) by a selective process. For example, if the interconnects 22 and 23 are nickel, they may be dissolved by a selective wet etch known in the industry.

Figure 6:
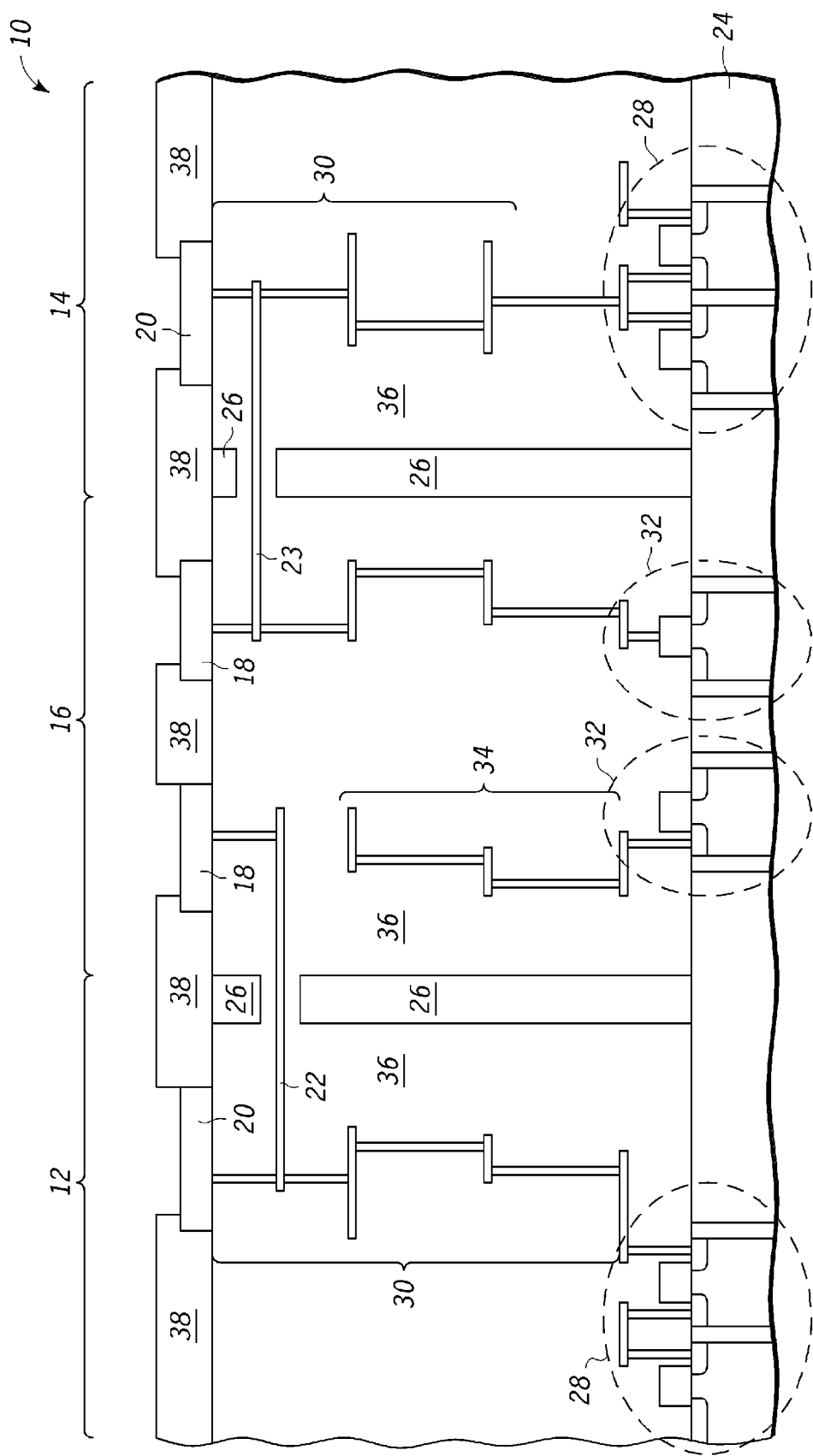
FIGS. 6-7 illustrate cross-sectional view of a portion of a semiconductor wafer according to one embodiment.

FIG. 6 illustrates a cross-section of a different embodiment. The embodiment shown in FIG. 6 is the same as that shown in FIG. 5 except that the interconnect 22 and 23 are underneath the first passivation 38. In the embodiment illustrated in FIG. 6, the interconnect 23 is electrically connected to the bond pads 20 and the scribe grid pads 18 via portions of the die metal layer 30 and, the scribe metal layer 34, while the interconnect 22 is electrically connected to the bond pads 20 and the scribe grid pads 18 via portions of the die metal layer 30, but not the scribe metal layer 34. Although it appears that the interconnects 22 and 23 bisect each of the edge seals 26, each edge seal is electrically connected to other portions of its edge seal in portions of the semiconductor wafer 10 that are not illustrated. The interconnects 22 and 23 can be formed at the same time as the die metal layers 30 and the scribe metal layers 34. In addition, the interconnects 22 and 23 can be at any level (e.g., metal level one or metal level six). In the embodiment, where the interconnects 22 and 23 are under the first passivation 38, a second passivation may not be formed.

Figure 7:
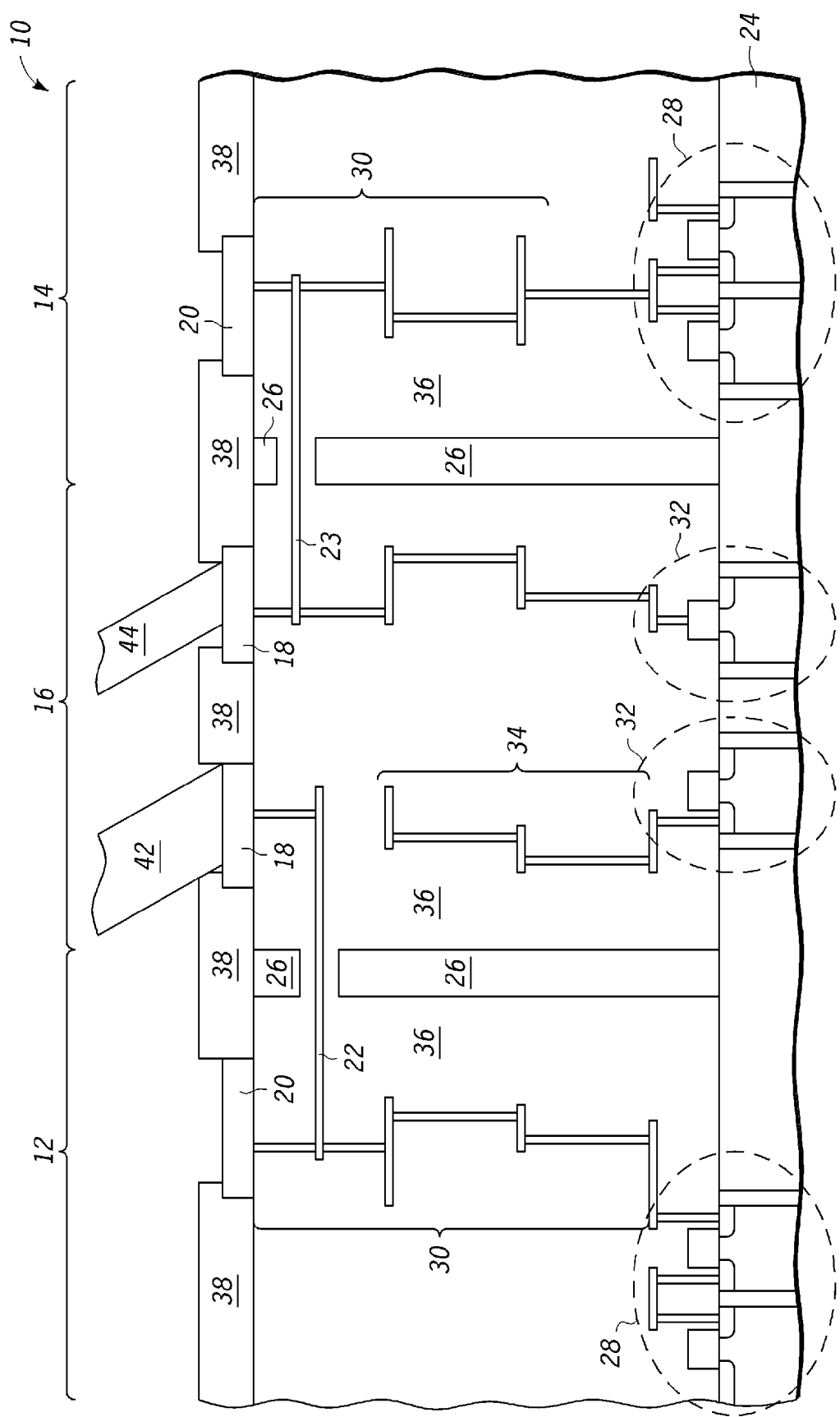

FIG. 7 illustrates one embodiment of accessing a scribe grid pad 18 to stimulate the die circuitry 28. In this embodiment, the accessing is performed using probe tips 42 and 44. However, any other suitable process or different probes (e.g., ones that do not intersect the semiconductor wafer 10 at a non-normal angle) may be used. The probe tip 42 accesses the scribe grid pad 18 via the interconnect 22, a portion of the die metal layers 30, and a portion of the scribe metal layers 34 to stimulate the die circuitry 28. While contacting the interconnect 22, the probe tip 42 lands on a portion of the first passivation 38. While landing on a portion of the second passivation 38 is not required, doing so does not negatively effect the probing process because the scribe grid pad can still be accessed to stimulate the die circuitry 28. The probe tip 44 accesses the scribe grid pad 18 via the interconnect 23, a portion of the die metal layers 30, and a portion of the scribe metal layers 34. Unlike probe tip 42, the probe tip 44 does not land on a part of the second passivation 40. Although the two illustrated scribe grid pads 18 are shown as being probed, not all of the scribe grid pads 18 may be probed.

Figure 8:
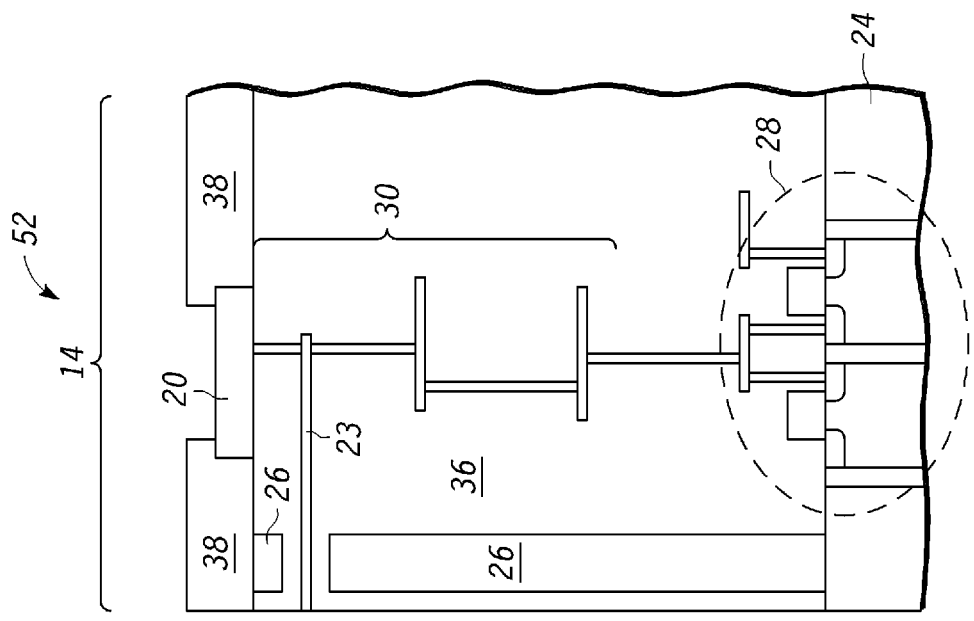
FIG. 8 illustrates the semiconductor wafer of FIG. 7 after singulation.
Figure 8:
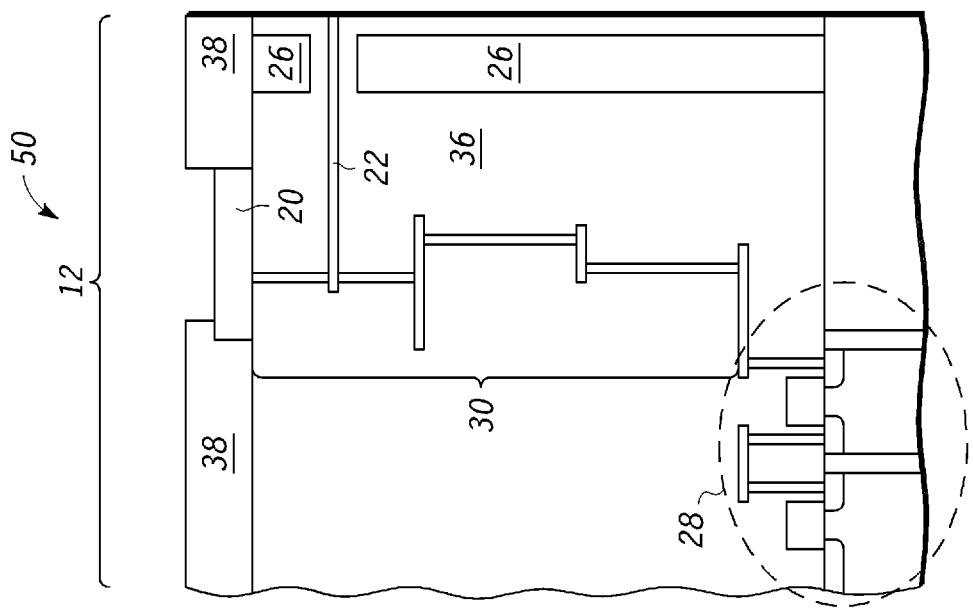

After accessing the scribe grid pads 18, the semiconductor wafer 10 is singulated to form singulated die 46 and 48, as shown in FIG. 8. The singulation process can occur by any process previously described. During the singulation process, the electrical connection of the scribe grid pad 18 to the die circuitry 28 is broken if not previously broken. This can occur by the interconnects 22 and 23 being broken or disconnected from the bond pad 20 or the scribe grid pad 18 during singulation. For example, the saw may break the interconnects 22 and 23. Alternatively, the electrical disconnection between the scribe grid pad 18 and the die circuitry 28 may occur prior to singulation. If the interconnects 22 and 23 are not covered by the second passivation 40 they can be removed by a selective process.

Figure 9:
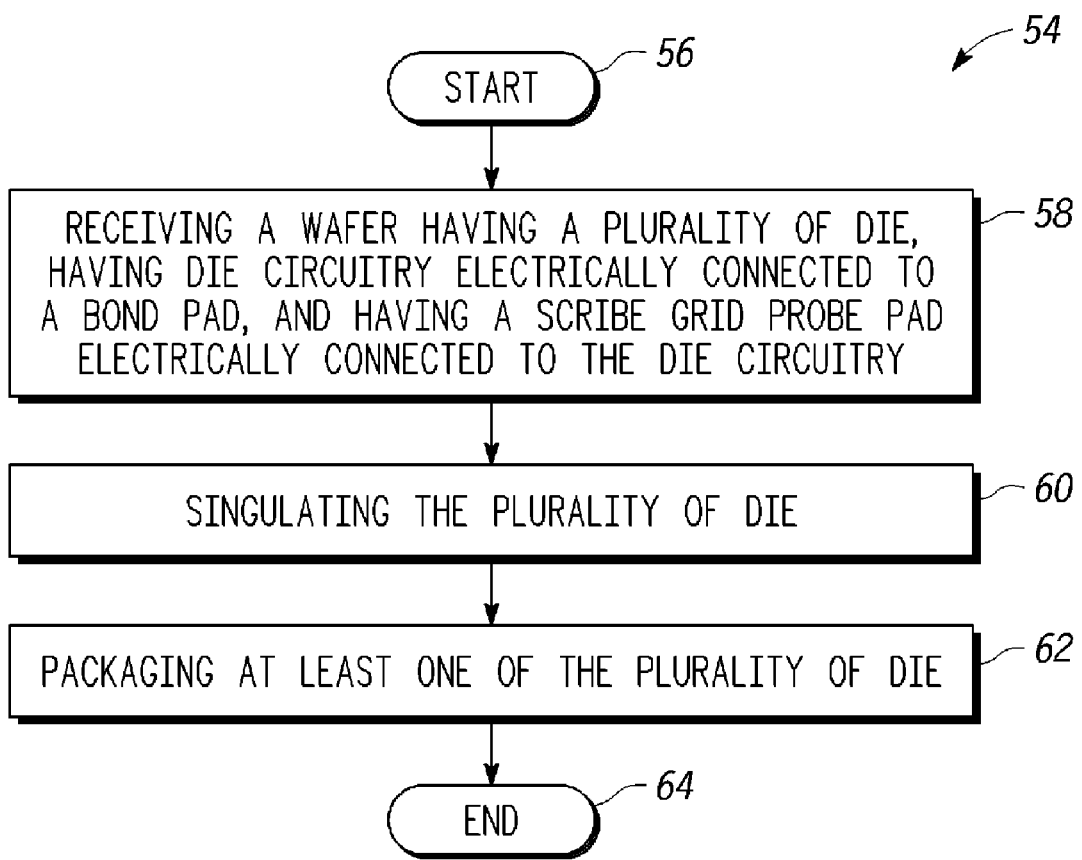
FIG. 9 illustrates a flow diagram of one embodiment.

FIG. 9 illustrates a flow 54 for forming a semiconductor device. After a start 56, a wafer is received 58, wherein the wafer has a plurality of die 12, 14, has die circuitry 28 electrically connected to a bond pad 20, and has a scribe grid pad 18 electrically connected to the die circuitry 28. After receiving the wafer, the interconnects 22 and 23 may be dissolved (not shown) if not covered by passivation or removed previously. Alternatively, the electrical connection between the scribe grid pad 18 and the die circuitry 28 can be destroyed (e.g., the interconnects 22 and 23 can be broken) at this time if not previously done. The electrical connection can be previously performed by dissolving a portion of the interconnects 22 and 23 if the portions are not covered by the second passivation 40. Alternatively, other processing can be done to break the electrical connection. For example, a physical process can be used. However, breaking the electrical connection might not occur at this time because it may be performed in subsequent processing (e.g., singulation.) The plurality of die is then singulated 60. The interconnects 22 and 23 may be disconnected from each other during the singulation. Any singulation process can be used, such as those previously described. Next, at least one of the plurality of die is packaged 62. The packaging may include any packing process, such as a ball grid array (BGA) process, a flip chip process, a quad-flat package (QFP) process, or the like.

There has been provided processes for stimulating die circuitry via accessing (e.g., by probing) a probe pad located in a scribe grid without damaging the underlying circuitry or having to limit the number of touchdowns because the semiconductor wafer 10 is contacted in the scribe grid and not over the die. This decreases the risk of damage to the die. Furthermore, bond pad is not contacted so that it is not damaged, which can cause problems when packaging (i.e., assembling) the die. In addition, the processes described are compatible with die having edge seals, do not increase die size by adding probe pads to the die, and allow for more flexibility in probe setup (if probe is used to access the die circuitry). Thus, the embodiments above allow for collection of parametric data and circuitry data without damaging the die. This is especially beneficial when using low-k or ultra low-k materials for the dielectric 36.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "plurality", as used herein, is defined as two or more than two. The term another, as used herein, is defined as at least a second or more.

The term "coupled", as used herein, is defined as connected, although not necessarily directly, and not necessarily mechanically.

What is claimed is:

1. A method comprising:
providing a wafer having a first die and a scribe grid, the first die having die circuitry and a bond pad electrically connected to the die circuitry, the scribe grid having a scribe grid pad electrically connected to the die circuitry;

accessing the scribe grid pad to stimulate the die circuitry; and disconnecting the die circuitry from the scribe grid pad prior to singulation.

2. The method of claim 1, wherein providing the wafer comprises:
forming the die circuitry;
forming a plurality of conductive layers electrically connected to the die circuitry;
forming the bond pad electrically connected to the die circuitry via at least one conductive layer of the plurality conductive layers; and
forming the scribe grid pad in the scribe grid electrically connected to the die circuitry via at least one conductive layer of the plurality conductive layers.

3. The method of claim 1, wherein providing the wafer comprises providing the wafer having the scribe grid, wherein the scribe grid further comprises scribe grid circuitry electrically connected to the scribe grid pad.

4. The method of claim 3, wherein providing the wafer comprises providing the wafer having the scribe grid circuitry, wherein the scribe grid circuitry comprises only passive circuitry.

5. The method of claim 3, wherein providing the wafer comprises providing the wafer having the scribe grid circuitry, wherein the scribe grid circuitry comprises active circuitry.

6. The method of claim 3, further comprising accessing the scribe grid pad to test the scribe grid circuitry.

7. The method of claim 1, wherein providing the wafer comprises providing the wafer, wherein the wafer has a second die, the second die having second die circuitry, wherein the scribe grid pad is electrically connected to the second die circuitry.

8. The method of claim 1, further comprising singulating and packaging the first die.

9. The method of claim 1, wherein providing the wafer comprises:
forming an interconnect extending from a conductive layer of the first die to a conductive layer of the scribe grid, wherein the bond pad is over the conductive layer of the first die and the scribe grid pad is over the conductive layer of the scribe grid, and the interconnect electrically connects the die circuitry to the scribe grid pad.

10. The method of claim 1, wherein providing the wafer comprises:
forming an interconnect over at least a portion of the bond pad and over at least a portion of the scribe grid pad, wherein the interconnect electrically connects the bond pad to the scribe grid pad.

11. The method of claim 1, wherein scribe grid pad is electrically connected to the die circuitry of the first die in a layer underlying the top surface of the wafer.

12. A method comprising:
receiving a wafer having a plurality of die and a scribe grid, a first die of the plurality of die having die circuitry and a bond pad electrically connected to the die circuitry, and the scribe grid having a scribe grid pad electrically connected to the die circuitry of the first die;
disconnecting the scribe grid pad from the die circuitry of the first die;
subsequently singulating the plurality of die; and
packaging at least one die of the plurality of die.

13. The method of claim 12, wherein scribe grid pad is electrically connected to the die circuitry of the first die in a layer underlying the top surface of the wafer.

14. The method of claim 12, wherein providing the wafer comprises:
forming the die circuitry;
forming a plurality of conductive layers electrically connected to the die circuitry;
forming the bond pad electrically connected to the die circuitry via at least one conductive layer of the plurality conductive layers; and
forming the scribe grid pad in the scribe grid electrically connected to the die circuitry via at least one conductive layer of the plurality conductive layers.

15. The method of claim 12, wherein providing the wafer comprises providing the wafer having the scribe grid, wherein the scribe grid further comprises scribe grid circuitry electrically connected to the scribe grid pad.

16. The method of claim 15, wherein providing the wafer comprises providing the wafer having the scribe grid circuitry, wherein the scribe grid circuitry comprises only passive circuitry.

17. The method of claim 15, wherein providing the wafer comprises providing the wafer having the scribe grid circuitry, wherein the scribe grid circuitry comprises active circuitry.

18. The method of claim 15, further comprising accessing the scribe grid pad to test the scribe grid circuitry.

19. The method of claim 12, wherein providing the wafer comprises providing the wafer, wherein the wafer has a second die, the second die having second die circuitry, wherein the scribe grid pad is electrically connected to the second die circuitry.

20. The method of claim 12, wherein providing the wafer comprises:
forming an interconnect extending from a conductive layer of the first die to a conductive layer of the scribe grid, wherein the bond pad is over the conductive layer of the first die and the scribe grid pad is over the conductive layer of the scribe grid, and the interconnect electrically connects the die circuitry to the scribe grid pad.

* * * * *